United States Patent [19]

Crampton et al.

[11] Patent Number: 5,119,042

[45] Date of Patent: Jun. 2, 1992

[54] SOLID STATE POWER AMPLIFIER WITH DYNAMICALLY ADJUSTED OPERATING POINT

[75] Inventors: David L. Crampton, Long Beach; Arnold L. Berman, Los Angeles; Joseph E. Davis, Redondo Beach, all of Calif.

[73] Assignee: Hughes Aircraft Company, Los Angeles, Calif.

[21] Appl. No.: 574,867

[22] Filed: Aug. 30, 1990

[51] Int. Cl.$^5$ ............................................. H03G 3/30
[52] U.S. Cl. .................................. 330/295; 330/136; 330/284; 330/285; 455/116; 455/126; 455/127; 455/129
[58] Field of Search .................. 330/124 R, 133, 136, 330/144, 145, 279, 284, 285, 295; 343/701, 720, DIG. 2; 455/116, 126, 127, 129

[56] References Cited

U.S. PATENT DOCUMENTS

| | | | |
|---|---|---|---|
| 3,900,823 | 8/1975 | Sokal et al. | 330/149 |
| 4,631,491 | 12/1986 | Smithers | 330/279 X |
| 4,868,520 | 9/1989 | Terafawa et al. | 330/295 |

*Primary Examiner*—James B. Mullins
*Attorney, Agent, or Firm*—Robert A. Westerlund; Steven M. Mitchell; Wanda K. Denson-Low

[57] ABSTRACT

RF power is sampled and measured at the input and output of a solid state power amplifier using directional couplers and matched square law detectors. Outputs from the detectors are applied to differential inputs of a DC operational amplifier. Outputs from the detectors are compared and filtered in the operational amplifier and the resulting difference signal is applied to a control input on a switching type power supply. The power supply converts a DC input voltage to the various positive and negative voltages required to operate the RF devices in the solid state power amplifier. When the control loop is closed, the supply voltage varies to maintain a constant operating point resulting in constant gain, efficiency, and linearity for the overall solid state power amplifier despite variations in signal levels and signal composition. In another embodiment, the solid state power amplifier has a series of single-ended low power amplifiers terminating in an output high power module. In the output module, one medium power device acts as a driver stage for four high power devices connected in parallel. The output stages are hybrid coupled, and isolators before and after these hybrid coupled output stages isolate the driver from the final amplifiers and protect the output devices from reflected signals. A dynamically controlled PIN diode variable attenuator at the amplifier input allows the operating point of the amplifier to be selected and adjusted while the closed loop function is in operation. A hybrid matrix power amplifier system is also disclosed.

4 Claims, 2 Drawing Sheets

SOLID STATE POWER AMPLIFIER WITH DYNAMICALLY ADJUSTED OPERATING POINT

BACKGROUND

The present invention relates to solid state power amplifier circuits for use in communication satellites and other RF microwave power amplifier applications.

Solid state power amplifiers may use either bipolar or field effect transistors. A solid state power amplifier exhibits gain compression if the desired output waveform requirement exceeds the available drain supply voltage. To obtain optimal operating efficiency, solid state power amplifiers are typically operated at a moderately compressed operating point, while still maintaining acceptable linearity. With fixed DC bias, a reduction in efficiency and an increase in power gain results when the input RF signal level is reduced below that required to obtain compressed operation. Since the output devices are biased with both RF and DC voltages, the operating point of the amplifier is determined by a combination of these voltages.

Similarly, for an increase in input signal level there is an associated increase in output power and a corresponding decrease in gain as the amplifier is driven further into compression. In multicarrier systems, these changes in operating point, with the corresponding changes in gain, linearity and efficiency may have profound effects on the system operation. In particular, this compression characteristic degrades the performance of systems, where the power gains of a matched group of asymmetrically driven solid state power amplifiers must remain matched. One such example is a multibeam phased array transmit antenna, where each element in the array is driven by a separate solid state power amplifier. Since output power to the elements is not uniformly distributed to form a particular beam, the power loading in the solid state power amplifiers associated with a beam driven at a high power level unbalances the gains of other solid state power amplifiers associated with other beams driven at lower power levels. This interaction results in decreased isolation between beams.

Messerschmitt-Boelkow-Blohm (MBB) developed an amplifier called the PAMELA (Power Amplifier Module for highly Efficient and highly Linear Applications) to overcome the above-described problems. The PAMELA is described in Product Note, 4/89-SSPA 2 published by MBB Space Systems Group, Communications Systems Dept., and entitled: "PAMELA, Highly Linear, Highly Efficient Solid State Power Amplifiers for the Mobile Satellite Service". In the PAMELA, the operating point of the amplifier is dynamically controlled by its load impedance. Load variation is controlled by three or more individual amplifiers operating through impedance inverters into a common fixed load. Drive-level-sensitive diode phase shifters are used to adjust the combining phases of the individual amplifiers. The resulting impedance match as seen at each amplifier output is a function of power level. The resulting operating bias point of the amplifier varies as a function of the output impedance match and therefore the drive level. Efficiency is maintained over a range of drive levels to the accuracy of the sequential contributions of components in the open loop system. However, it is a disadvantage that the gain and linearity vary with input signal level.

It is an objective of the present invention to provide a solid state power amplifier that operates at a substantially constant efficiency over a wide range of input and output power levels. Another objective of the invention is the provision of a solid state power amplifier that maintains constant gain and linearity in addition to constant efficiency over a range of input and output signal levels. Yet another objective of the present invention is to provide a solid state power amplifier that has a dynamically adjusted and selected operating point.

SUMMARY OF THE INVENTION

In accordance with these and other features and objectives of the invention, there is provided a solid state power amplifier incorporating two detectors to measure the power gain thereof and dynamically adjust the DC bias applied to the amplifier to maintain a constant operating point resulting in constant gain, linearity and efficiency for a range of output power variations. By incorporating the measurement of power gain in a closed loop that automatically adjusts the DC bias voltages, it becomes possible to simultaneously maintain constant gain and linearity in addition to constant efficiency over a range of input signal levels. Another embodiment of the invention uses a feedback signal from a comparator/integrator to drive a variable attenuator at the amplifier input, in combination with varying the power supply voltages. This additional attenuator allows the solid state power amplifier's saturated operating point to be dynamically adjusted and selected while at the same time a closed loop automatically maintains this selected operating point over a range of RF signal levels.

An exemplary embodiment of the circuit comprises two power detectors, a comparator/integrator, multiple stages of solid state power amplification, and a switching type power supply capable of a continuously variable range of output voltages changing as a function of an input control voltage. RF power is sampled and measured at the input and output of the solid state power amplifier using matched power detectors. Outputs from the detectors are compared and the difference signal integrated, resulting in a signal applied to the power supply control line. The power supply output voltage is applied to the solid state power amplification stages. When the control loop is closed, the supply voltage varies to maintain a constant operating point, resulting in constant gain, efficiency, and linearity for the overall solid state power amplifier despite variations in the input or output levels. Since the system is closed loop, the accuracy of the gain tracking depends only on the stability of the power detectors.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
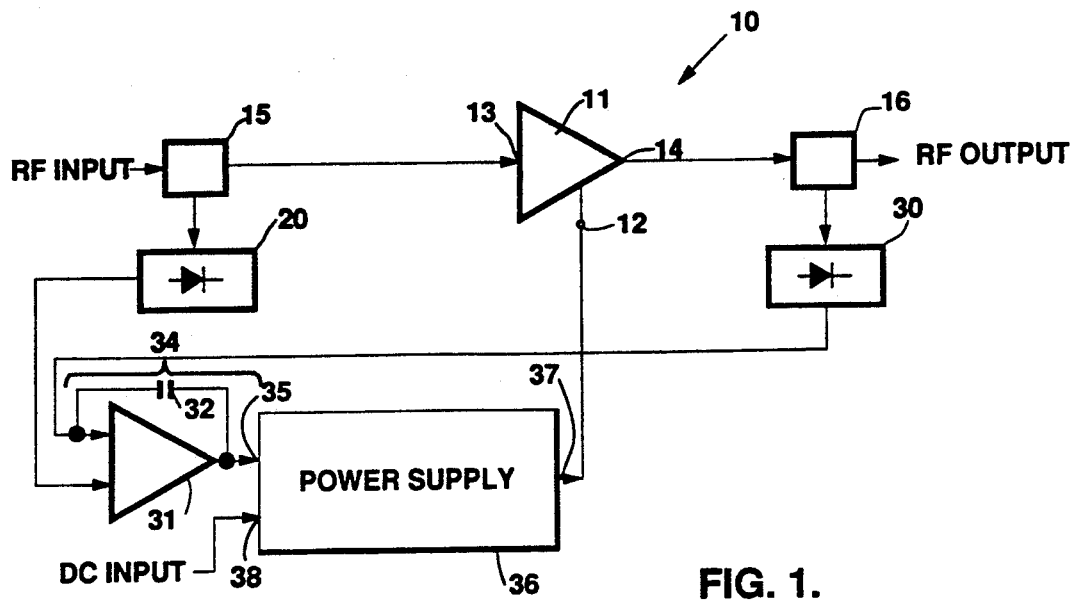
FIG. 1 is a schematic diagram of an exemplary embodiment of a simplified solid state power amplifier circuit constructed in accordance with the principles of the present invention.

Referring now to the drawings, FIG. 1 shows a schematic diagram of a simplified solid state power amplifier circuit 10 constructed in accordance with the principles of the present invention. The circuit 10 comprises an amplifier 11 which may be a bipolar transistor or a field effect transistor, such as a type FLM 1415-20 semiconductor device for example. The amplifier 11 is typically a microwave device and in this example operating in the range of 1530 to 1559 MHz. The operating point of the amplifier 11 is established or selected such that it operates as close to compression as possible while still maintaining acceptable linearity. The operating voltages and currents, including the DC bias, are applied to the amplifier 11 at a power supply terminal 12. As will be explained hereinafter, the operating point of the amplifier 11 is maintained constant by dynamically varying the voltages applied thereto in response to signals obtained from detectors located before and after the amplifier 11. The amplifier 11 has an input terminal 13 and an output terminal 14. An RF input signal is applied to the input terminal 13, and an amplified RF output signal appears at the output terminal 14.

The power gain of the amplifier 11 is measured by sampling and comparing the RF input signal power and the RF output signal power. To this end, a first sampling device 15 is coupled to the RF input signal, and a second sampling device 16 is coupled to the RF output signal. The RF coupling or sampling devices 15, 16 may comprise directional couplers, Tee junctions, or other suitable couplers that sample the RF energy. The output of the first sampling device 15 is connected to a first power detector 20, while the output of the second sampling device 16 is connected to a second power detector 30. The two power detectors 20, 30 are matched square law detectors. The output of the power detectors 20, 30 is applied to differential inputs of a DC operational amplifier 31. The operational amplifier 31 has a capacitor 32 connected from the output to one of the differential inputs and the resulting circuit arrangement serves as a comparator/integrator 34. The output of the comparator/integrator 34 is connected to a sense input 35 on a switching type power supply 36. The power supply 36 has an output terminal 37 connected to the power supply terminal 12 of the amplifier 11, and has an input terminal 38 connected to a DC input.

Thus, a closed loop circuit is provided that incorporates two detectors 20, 30 to measure the power gain of the amplifier 11 and dynamically adjust the DC bias applied to the amplifier 11. Essentially constant efficiency can be maintained over a range of output powers by varying the DC voltages applied to the solid state amplifier 11. By incorporating the measurement of power gain in a closed loop that adjusts these voltages, it becomes possible to maintain a fixed operating point resulting in the simultaneous maintenance of constant gain, efficiency, and linearity over a range of input and output signal levels.

In operation, the circuit functions as a closed feedback loop comprising two power detectors, 20, 30, a comparator/integrator 34, a semiconductor amplifier 11, and a switching type power supply 36. RF power is sampled and measured at the input and output of the amplifier 11 using the matched power detectors 20, 30. Outputs from the detectors 20, 30 are compared and filtered and the resulting difference signal applied to the power supply sense input 35. The power supply output voltage is applied to the amplifier 11. When the control loop is closed, the supply voltage varies to maintain a constant operating point resulting in constant gain, efficiency, and linearity for the solid state power amplifier circuit 10. Since the system is closed loop, the accuracy of the gain tracking depends only on the stability of the power detectors 20, 30.

Figure 2:
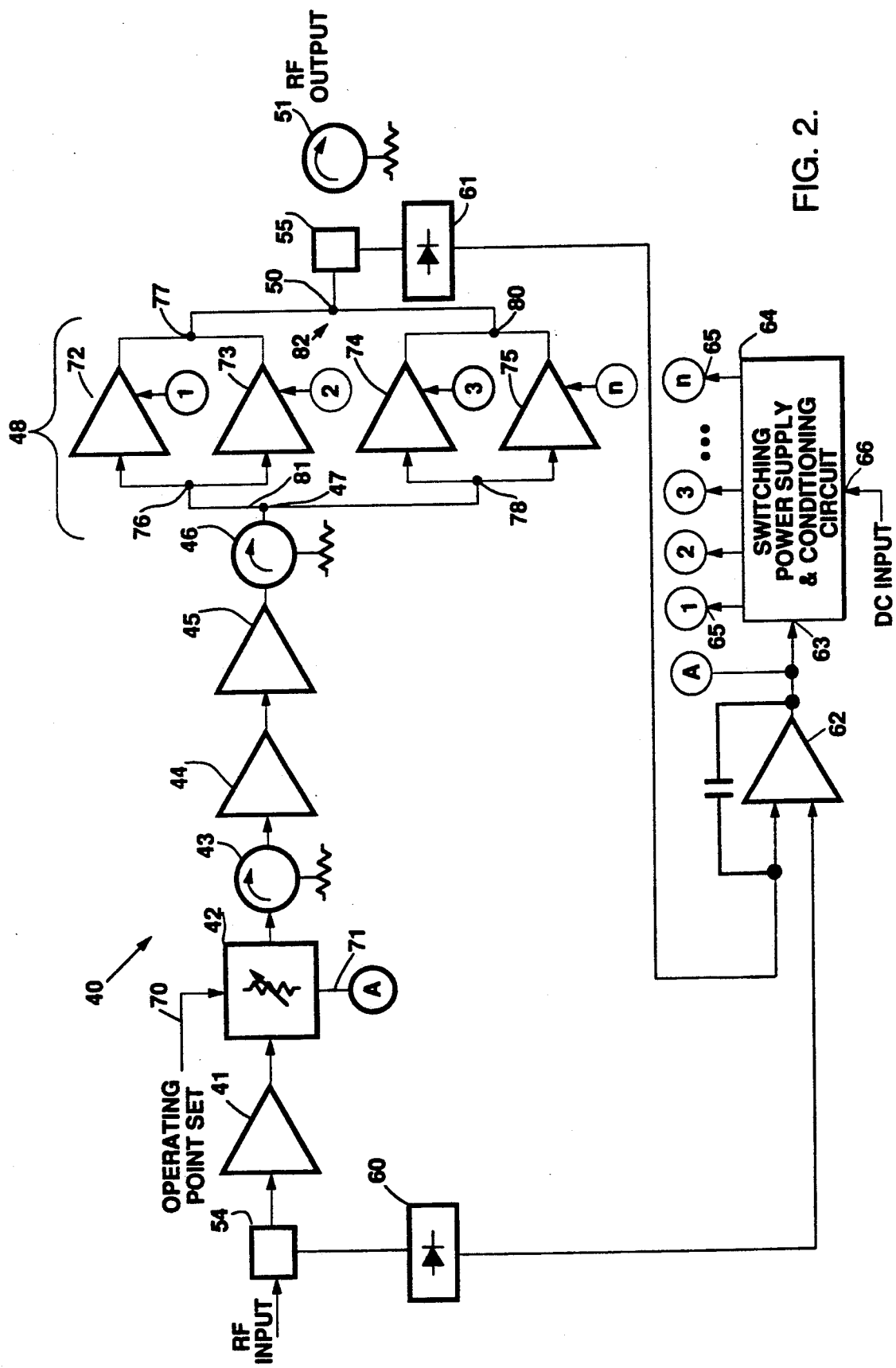
FIG. 2 is a schematic diagram of a second embodiment of a solid state power amplifier circuit showing a plurality of matched power amplifiers.

FIG. 2 is a schematic diagram of another embodiment of a solid state power amplifier circuit 40 constructed in accordance with the principles of the present invention. This embodiment of a solid state power amplifier circuit 40 is provided with an input amplifier 41 having an input terminal and an output terminal. An RF input signal is applied to the input terminal of the input amplifier 41. The input amplifier 41 has an output terminal connected through a PIN diode attenuator circuit 42 and a first isolator 43 to an input terminal of a pre-driver amplifier 44. The pre-driver amplifier has an output connected to an input terminal of a driver amplifier 45. The driver amplifier 45 has an output connected through a second isolator 46 to an input terminal 47 of a power amplifier 48 which has an output terminal 50. The power amplifier 48 provides an amplified RF output by way of a third isolator 51. The RF signal appearing at the output of the third isolator 51 is the RF output signal of the solid state power amplifier circuit 40.

An input sampling device 54, which may be a directional coupler or the like, is provided to sample the RF input power at the input terminal of the input amplifier 41, which is also the input terminal of the solid state power amplifier circuit 40. Similarly, an output sampling device 55, which may also be a directional coupler or the like, is provided to sample the RF output power at the output terminal 50 of the power amplifier 48 which is also the output terminal of the solid state power amplifier circuit 40.

The output of the input sampling device 54 is connected to a first power detector 60, while the output of the output sampling device 55 is connected to a second power detector 61. The first and second power detectors 60, 61 are matched square law detectors. The outputs of the power detectors 60, 61 are applied to differential inputs of a DC operational amplifier 62. The output of the operational amplifier 62 is connected to a sense input 63 on a switching type power supply 64. The power supply 64 has output terminals 65 connected to the power amplifier 48, and has an input terminal 66 connected to a DC input.

The PIN diode attenuator circuit 42 has two control inputs 70, 71. The first control input 70 permits setting the RF attenuation of the attenuator circuit 42. The second control input 71 is connected to the output of the DC operational amplifier 62. The feedback signal from the operational amplifier 62 may be employed to drive the PIN diode attenuator circuit 42 at the input of the solid state power amplifier circuit 40 either separately or in combination with varying the voltages from the power supply 64. This additional attenuator circuit 42 allows the saturated operating point of the solid state power amplifier 48 to be dynamically adjusted and selected while at the same time a closed loop automatically maintains this selected operating point over a range of RF signal levels.

The PIN diode attenuator circuit 42 also is used to protect the power amplifier 48 from being overdriven. The PIN diode attenuator circuit 42 senses the gate current of the semiconductor devices used in the power amplifier 48. A signal representing a predetermined set point is applied to the first control input 70. When the gate current exceeds the predetermined set point, thus indicating overdrive, a control voltage is applied to the second control input 71 of the PIN diode attenuator circuit 42 to keep the signals that are applied to the driver amplifier 45 and the power amplifier 48 at safe levels. The PIN diode attenuator circuit 42 is also used in conjunction with a simple gain control circuit to maintain constant gain for the entire solid state power amplifier circuit 40.

As shown in FIG. 2, the solid state power amplifier circuit 40 comprises single-ended low power amplifiers 41, 44 cascaded in series, followed by a medium power driver amplifier 45 driving the power amplifier 48. The input amplifier 41 may comprise any suitable low power semiconductor device, while the pre-driver amplifier 44 may be a type FLL171ME semiconductor device, or the like. The driver amplifier 45 may comprise a medium power semiconductor device such as a type FLL100MK device, or the like. The first, second, and third isolators 43, 46, 51 disposed before and after the driver amplifier 45 and the power amplifier 48 isolate the driver amplifier 45 from the power amplifier 48 and protect the power amplifier 48 from reflected signals. The isolators 43, 46, 51 may comprise ferrite circulators, or the like, in which any reflected signals entering the output port are dissipated in a resistive termination. The driver amplifier 45 is well isolated from the following power amplifier 48 with typically a greater than 30 dB return loss.

The power amplifier 48 comprises four semiconductor devices 72, 73, 74, 75 connected in parallel to obtain the required power output. The type FLM 1415-20 device, or the like, may be used for the power amplifier 48. The semiconductor devices 72, 73, 74, 75 are connected in pairs. The first pair of semiconductor devices 72, 73 have input terminals connected to a first hybrid junction 76, and output terminals connected to a second hybrid junction 77. Similarly, the second pair of semiconductor devices 74, 75 have input terminals connected to a third hybrid junction 78, and output terminals connected to a fourth hybrid junction 80. The first and third hybrid junctions 76, 78 are connected together by a fifth hybrid junction 81 coupled to the input terminal 47 of the power amplifier 48. Similarly, the second and fourth hybrid junctions 77, 80 are connected together by a sixth hybrid junction 82 coupled to the output terminal 50 of the power amplifier 48.

These hybrid junctions 76, 77, 78, 80, 81, 82 are devices similar to a Magic Tee. For certain applications such as on satellites, they may be constructed as squareax couplers and coaxial isolators. These squareax hybrid couplers have less than 0.05 dB of insertion loss per path. Combined losses due to phase and amplitude imbalance in the couplers are less than 0.01 dB. Thus, for a pair of hybrid couplers, signal power at the null port is at least 35 dB below the power at the sum port across the band. Similarly, in the power amplifier 48, the FLM 1415-20 devices are matched to have equal saturated output power levels, thereby limiting the overall combining losses to less than 0.1 dB per hybrid pass.

The closed loop comprising the input sampling device 54, output sampling device 55, detectors 60, 61, operational amplifier 62, power supply 64 and power amplifier 48, plus the PIN diode attenuator circuit 42 is sometimes referred to herein as a dynamic control circuit because it dynamically maintains the operating point of the power amplifier 48 in response to changing signal conditions.

In accordance with the principles of the invention, the dynamic control circuit samples signal level at the input and output of the solid state power amplifier circuit 40 through sampling devices 54, 55 such as directional couplers and associated power detectors 60, 61. The dynamic control circuit of the present invention uses matched square law detectors 60, 61 to provide differential inputs to the DC operational amplifier 62. The operational amplifier 62 in turn controls drain voltages to dynamically maintain the saturated operating point of the semiconductor devices 72, 73, 74, 75 in the power amplifier 48.

Initially, the dynamic control circuit receives an input voltage proportional to total input signal power. This voltage is used to set the first control input 70 of the PIN diode attenuator circuit 42 to correspond to the system operating point. For a given operating point, the dynamic gain control circuit then maintains a constant overall gain for the solid state power amplifier circuit 40 by varying the drain voltages of the semiconductor devices 72, 73, 74, 75 in the power amplifier 48.

The power supply 64 of the solid state power amplifier circuit 40 is a highly efficient switching type power supply 64 that converts the DC power applied to the DC input terminal 66 to the various positive and negative voltages required to operate the RF devices. In addition, the power supply 64 accepts a control voltage at the sense input 63 and adjusts RF device voltages to maintain a constant operating point over the RF input dynamic range.

The dynamic control circuit maintains a constant operating point resulting in constant gain, linearity and efficiency over a differential (traffic mix) dynamic range of +2/−4 dB from a selected output power level. As the input signal level applied to the semiconductor devices 72, 73, 74, 75 increases above the average, the semiconductor devices 72, 73, 74, 75 are driven further into compression. The drain voltages of the semiconductor devices 72, 73, 74, 75 are increased to maintain constant gain. The NPR, phase shift, and efficiency vary slowly as the drain voltages are adjusted to compensate for a +2/−4 dB differential change in input level due to changes in traffic mix at a given system operating point.

Figure 3:
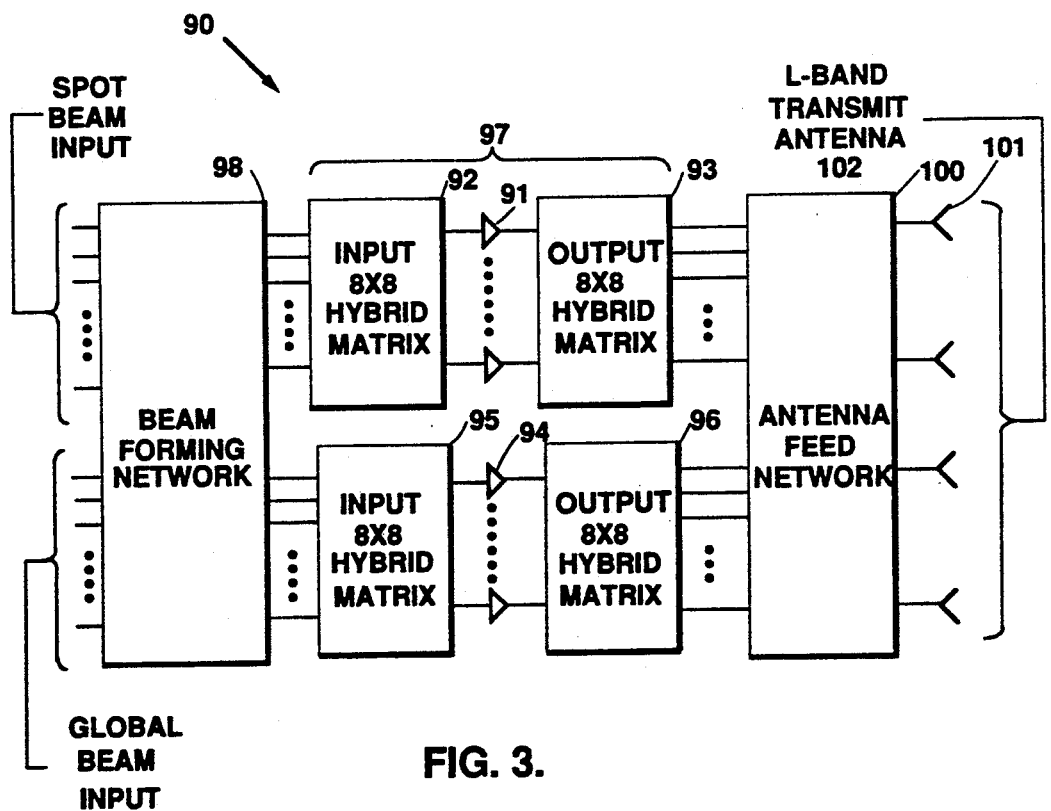
FIG. 3 is a schematic drawing of a hybrid matrix power amplifier system suitable for use in a communications satellite and showing a plurality of solid state power amplifiers disposed between a pair of hybrid matrices.

Referring now to FIG. 3 of the drawings, there is shown a schematic diagram of an embodiment of a hybrid matrix power amplifier system 90 suitable for use in a communications satellite, or the like. Some satellites such as the International Maritime Satellite known as INMARSAT III, for example, employ a multi-beam phased array transmit antenna in which each element in the antenna array is driven by a separate solid state power amplifier. In such arrangements, the solid state power amplifiers must be matched in gain and phase. Differential variations in phase, gain, or linearity among the solid state amplifier set will degrade the performance of the system. Since output power to the elements is not uniformly distributed to form a particular beam, the power gain seen in the solid state power amplifiers associated with a highly driven beam is decreased below the gains of solid state power amplifiers associated with other beams being driven at lower power levels. This results in decreased isolation between beams.

As shown in FIG. 3, eight solid state power amplifiers 91 are embedded between first and second hybrid matrices 92, 93. Similarly, eight solid state power amplifiers 94 are embedded between third and fourth hybrid matrices 95, 96. The result is a hybrid matrix power amplifier 97. In the present exemplary embodiment, the hybrid matrices 92, 93, 95, 96 are adapted to switch eight input ports to eight output ports. In the present example, a total of 16 operating solid state power amplifiers 91, 94 are embedded between the hybrid matrices 92, 93, 95, 96. All 16 solid state power amplifiers 91, 94 must remain matched in gain and phase at the system operating point over the full range of signals presented to each of the 16 solid state power amplifiers 91, 94. This requires maintenance of constant amplifier power gain about the nominal compressed operating point by dynamically varying the device voltages in accordance with the principles described hereinabove in connection with the embodiments shown in FIGS. 1 and 2.

The hybrid matrix power amplifier 97 is disposed between a beamforming network 98 and an antenna feed network 100. The beamforming network 98 has input ports coupled to spot beam antenna inputs and to global beam antenna inputs. The beamforming network 98 has output ports coupled to input ports of the first and third or input hybrid matrices 92, 95. The first hybrid matrix 92 has output ports coupled to input ports on the first eight solid state power amplifiers 91. The first eight solid state power amplifiers 91 have output ports coupled to input ports on the second hybrid matrix 93. Similarly, the third hybrid matrix 95 has output ports coupled to input ports on the remaining eight solid state power amplifiers 94. These solid state power amplifiers 94 have output ports coupled to input ports on the fourth hybrid matrix 96. The second and fourth or output hybrid matrices 93, 96 have output ports coupled to the antenna feed network 100 which drives individual antenna elements 101 of an L-band transmit antenna 102.

Placing the hybrid matrix power amplifier 97 between the beamforming network 98 and the antenna feed network 100 allows complete and continuous sharing of the total available RF power among the L-band antenna elements 101 to provide both L-band spot beams and L-band global beams. For a signal arriving at any of the input ports of the input hybrid matrices 92, 95, the signal is evenly distributed to all the 16 solid state power amplifiers 91, 94. Then, the output hybrid matrices 93, 96 refocus the signals from the output of the 16 solid state power amplifiers 91, 94 back to the corresponding output port.

The solid state power amplifiers 91, 94 must be matched in gain and phase at the system operating point for this system to operate properly. In the INMARSAT III satellite, for example, where antenna feeds are shared among the antenna beams, and where traffic may be shifted among five spot antenna beams and global antenna beams, all the solid state power amplifiers 91, 94 must remain matched in gain and phase over the full range of signals presented to each solid state power amplifier 91, 94 +2, −4 dB from a nominal level. Further, to maintain system linearity, individual amplifier linearity must also be maintained over this dynamic range. By employing the principles of the present invention, it is possible to realize high linearity and efficiency, and to maintain this performance with constant gain, over this traffic-mix-dependent dynamic range. The present invention maintains constant amplifier gain about the nominal operating point by dynamically varying the device voltages. This maintains a constant operating point resulting in constant amplifier gain as individual amplifier inputs vary both in level and in composition from a single continuous wave signal to a large number of multicarriers (noise loading). The principles of the present invention are used to maintain linearity and to provide efficient power sharing in the presence of individual amplifier level differences due to varying traffic patterns. Similarly, variations in phase, NPR, and amplifier efficiency are also maintained within acceptably small ranges.

Thus, there has been described a new and improved solid state power amplifier having a dynamically adjusted operating point. The solid state power amplifier of the present invention operates at a substantially constant efficiency over a wide range of output powers, and maintains constant gain and linearity in addition to constant efficiency over a range of input and output signal levels.

It is to be understood that the above-described embodiments are merely illustrative of some of the many specific embodiments which represent applications of the principles of the present invention. Clearly, numerous and other varied arrangements can be readily devised by those skilled in the art without departing from the scope of the invention.

What is claimed is:

1. A closed-loop power amplifier circuit having an RF input, RF output, and a controlled and constant compressed operating point, comprising:
   an input sampling device electrically coupled to the RF input and adapted to electrically sample the power of an RF input signal applied to the RF input;
   an input power detector connected to the input sampling device, for detecting and measuring the electrical power level of the RF input signal;
   a solid state power amplifier connected to the input sampling device;
   an output sampling device electrically coupled to an output of the solid state power amplifier and adapted to electrically sample an RF output signal produced from the RF output;
   an output power detector connected to the output sampling device and matched in electrical characteristics to the input power detector;
   a comparator/integrator means coupled to the input and output detectors for accepting outputs from both the input and output detectors and comparing them, for generating a difference signal as a measure of gain, and for filtering the difference signal;
   a power supply coupled to the comparator/integrator means, which accepts the difference signal from the comparator/integrator means, and is adapted to supply varying bias voltages to the solid state power amplifier via electrical conductors, and feedback control voltages to the solid state power amplifier to dynamically maintain the compressed operating point of the closed-loop power amplifier circuit such that constant gain, linearity, and efficiency is maintained for a range of power variations of the RF input and output signals; and,
   wherein the solid state amplifier comprises;

an input amplifier stage adapted to receive the RF input signal from the input sampling device;

a PIN attenuator having one input connected to the input amplifier stage and having another input adapted to receive operating point settings;

a first isolator connected to an output of the PIN attenuator, in which reflected signals are dissipated in a resistive termination;

a pre-driver amplifier having an input connected to an output of the first isolator;

a driver amplifier having an input connected to an output of the pre-driver amplifier;

a second isolator connected to an output of the driver amplifier, in which reflected signals are dissipated in a resistive termination; and a solid state hybrid power amplifier stage connected to the second isolator, comprised of multiple solid state power amplifiers, wherein the DC bias voltages of each solid state power amplifier is dynamically variable and controllable; and wherein said closed-loop power amplifier circuit further comprises a third isolator connected to the output of the output sampling device, in which reflected signals are dissipated in a resistive termination.

2. The closed-loop power amplifier circuit of claim 1 wherein the power supply comprises:

a switching power supply coupled to the comparator/integrator means, which accepts the difference signal from the comparator/integrator means, wherein the switching power supply is adapted to supply varying bias voltages to each amplifier of the solid state hybrid power amplifier stage via electrical conductors, feed back control voltages, to dynamically change the applied voltages to the overall closed-loop hybrid power amplifier circuit, such that a constant operating point resulting in constant gain, linearity and efficiency is maintained for a range of input and output power variations.

3. A closed-loop hybrid power amplifier circuit having a RF input, RF output and an operating point, comprising:

an input sampling device electrically coupled to the RF input for electrically sampling the RF input signal power;

an input power detector connected to the input sampling device for detecting and measuring the electrical power intensity of the RF input signal;

an input amplifier stage for receiving the RF input from the input sampling device;

a PIN attenuator having one input connected to the input amplifier stage and having another input adapted to receive operating point settings;

a first isolator connected to the output of the PIN attenuator;

a pre-driver amplifier having an input connected to the output of the first isolator;

a driver amplifier having an input connected to an output of the pre-driver amplifier;

a second isolator connected to the output of the driver amplifier;

a solid state hybrid power amplifier stage connected to the second isolator, comprised of multiple solid state power amplifiers, wherein the DC bias voltages of each solid state power amplifier is dynamically variable and controllable;

an output sampling device electrically coupled to the output of the solid state power amplifier stage for electrically sampling the RF output signal;

an output power detector connected to the output sampling device and matched in electrical characteristics to the input power detector;

a third isolator connected to the output of the output sampling device;

comparator/integrator means coupled to the input and output detectors for accepting the outputs from the input and output detectors and comparing them, for generating a difference signal as a measure of the gain, and for filtering the difference signal; and a switching power supply coupled to the comparator/integrator means, which accepts the difference signal from the comparator/integrator means, for supplying varying bias voltages to each amplifier of the solid state hybrid power amplifier stage via electrical conductors, feeding back control voltages, and for dynamically changing the applied voltages to the overall closed-loop hybrid power amplifier circuit, such that a constant operating point resulting in constant gain, linearity and efficiency is maintained for a range of input and output power variations.

4. A hybrid matrix power amplifier system for RF communication satellites comprising:

a beam forming network accepting a plurality of input electromagnetic wave beams and generating a plurality of corresponding RF output signals;

an input hybrid distribution matrix adapted to receive the RF output signals from the beam forming network;

a set of closed loop solid state amplifiers adapted to receive the RF output signals from the input hybrid distribution matrix, wherein the DC bias voltages of each solid state power amplifier within the set is under closed loop dynamic control, and wherein all of the solid state power amplifiers within the set are matched in gain and phase at the system operating point;

an output hybrid distribution matrix adapted to receive the RF output signals from the closed loop solid state power amplifiers, and adapted to refocus the RF signals to a corresponding output; and an antenna feed distribution network connected to the output of the output hybrid distribution matrix, which provides a signal distribution function for transmitting antennas.

* * * * *